United States Patent
Dennison

(10) Patent No.: US 7,399,655 B2
(45) Date of Patent: Jul. 15, 2008

(54) DAMASCENE CONDUCTIVE LINE FOR CONTACTING AN UNDERLYING MEMORY ELEMENT

(75) Inventor: Charles H. Dennison, San Jose, CA (US)

(73) Assignee: Ovonyx, Inc., Boise, ID (US)

( * ) Notice: Subject to any disclaimer, the term of this patent is extended or adjusted under 35 U.S.C. 154(b) by 600 days.

(21) Appl. No.: 10/633,886

(22) Filed: Aug. 4, 2003

(65) Prior Publication Data

US 2005/0029627 A1    Feb. 10, 2005

(51) Int. Cl.
*H01L 21/00* (2006.01)
(52) U.S. Cl. .................... 438/95; 257/E31.029
(58) Field of Classification Search ............. 257/1–5, 257/42, E29.002, E31.029; 438/618, 3, 95, 438/900
See application file for complete search history.

(56) References Cited

U.S. PATENT DOCUMENTS

| | | | |
|---|---|---|---|
| 5,970,336 A | 10/1999 | Wolstenholme et al. | |
| 6,567,293 B1 | 5/2003 | Lowrey et al. | |
| 6,569,705 B2 * | 5/2003 | Chiang et al. | 438/95 |
| 6,593,176 B2 * | 7/2003 | Dennison | 438/200 |
| 6,791,107 B2 * | 9/2004 | Gill et al. | 257/20 |
| 6,795,338 B2 * | 9/2004 | Parkinson et al. | 365/163 |
| 7,227,171 B2 * | 6/2007 | Bez et al. | 257/3 |
| 2002/0079483 A1 * | 6/2002 | Dennison | 257/5 |
| 2002/0177292 A1 * | 11/2002 | Dennison | 438/587 |
| 2003/0132501 A1 * | 7/2003 | Gill et al. | 257/505 |
| 2003/0186468 A1 * | 10/2003 | Lazaroff et al. | 438/3 |
| 2003/0219924 A1 * | 11/2003 | Bez et al. | 438/102 |
| 2005/0111247 A1 * | 5/2005 | Takaura et al. | 365/2 |
| 2005/0239243 A1 * | 10/2005 | Tran et al. | 438/239 |
| 2005/0239244 A1 * | 10/2005 | Tran et al. | 438/244 |

FOREIGN PATENT DOCUMENTS

DE    251 225 A1    11/1987
WO    WO 2004/090984    10/2004

OTHER PUBLICATIONS

Hwang, Y.N., Hong, J.S., Lee, S.H., Ahn, S.J., Jeong, G.T., Koh, G.H., Kim, H.J., Jeong, W.C., Lee, S.Y., Park, J.H., Ryoo, K.C.., Horii, H., Ha, Y.H., Yi, J.H., Cho, W.Y., Kim, Y.T., Lee, K.H., Joo, S.H., Park, S.O., Jeong, U.I., Jeong, H.S. and Kim, Kinam, "Completely CMOS-Compatible Phase-Change Nonvolatile RAM Using NMOS Cell Transistors," presented at 2003 19th IEEE Non-Volatile Semiconductor Memory Workshop, Monterey, California, Feb. 26-20, 2003.

(Continued)

*Primary Examiner*—Thao P. Le
(74) *Attorney, Agent, or Firm*—Trop, Pruner & Hu, P.C.

(57) ABSTRACT

A damascene approach may be utilized to form an electrode to a lower conductive line in a phase change memory. The phase change memory may be formed of a plurality of isolated memory cells, each including a phase change memory threshold switch and a phase change memory storage element.

19 Claims, 8 Drawing Sheets

OTHER PUBLICATIONS

Ha, Y.H., Yi, J.H., Horii, H., Park, J.H., Joo, S.H., Park, S.O., Chung, U-In and Moon, J.T., "An Edge Contact Type Cell for Phase Change,RAM Featuring Very Low Power Consumption," presented at IEEE 2003 Symposium on VLSI Technology, Kyoto, Japan, Jun. 12-14, 2003.

Hwang, Y.N., Hong, J.S., Lee, S.H., Ahn, S.J., Jeong, G.T., Koh, G.H., Oh, J.H., Kim, H.J., Jeong, W.C., Lee, S.Y., Park, J.H., Ryoo, K.C., Horii, H., Ha, Y.H., Yi, J.H., Cho, W.Y., Kim, Y.T., Lee, K.H., Joo, S.H., Park, S.O., Chung, U.I., Jeong, H.S. and Kim, Kinam, "Full Integration and Reliability Evaluation of Phase-change RAM Based on 0.24 mm-CMOS Technologies," presented at IEEE 2003 Symposium on VLSI Technology, Kyoto, Japan, Jun. 12-14, 2003.

Horii, H., Yi, J.H., Park, J.H., Ha, Y.H., Baek, I.G., Park, S.O., Hwang, Y.N., Lee, S.H., Kim, Y.T., Lee, K.H., Chung, U-In and Moon, J.T., "A Novel Cell Technology Using N-doped GeSbTe Films for Phase Change RAM," presented at IEEE 2003 Symposium on VLSI Technology, Kyoto, Japan, Jun. 12-14, 2003.

Chiang, C., Lee, J.W., Kersey, P., U.S. Appl. No. 09/745,835, filed Dec. 21, 2000 entitled "Metal Structure for a Phase-Change Memory Device", 6569705.

Horii, H., Yi, J.H., Park, J.H., Ha, Y.H., Baek, I.G., Park, S.O., Hwang, Y.N., Lee, S.H., Kim, Y.T., Lee, K.H., Chung, U-In and Moon, J.T., "A Novel Cell Technology Using N-doped GeSbTe Films for Phase Change RAM," presented at IEEE 2003 Symposium on VLSI Technology, Kyoto, Japan, Jun. 12-14, 2003.

\* cited by examiner

DAMASCENE CONDUCTIVE LINE FOR CONTACTING AN UNDERLYING MEMORY ELEMENT

BACKGROUND

This invention relates generally to phase change memories.

Phase change memory devices use phase change materials, i.e., materials that may be electrically switched between a generally amorphous and a generally crystalline state, as an electronic memory. One type of memory element utilizes a phase change material that may be, in one application, electrically switched between generally amorphous and generally crystalline local orders or between the different detectable states of local order across the entire spectrum between completely amorphous and completely crystalline states.

Typical materials suitable for such an application include various chalcogenide elements. The state of the phase change materials is also non-volatile. When the memory is set in either a crystalline, semi-crystalline, amorphous, or semi-amorphous state representing a resistance value, that value is retained until reprogrammed, even if power is removed. This is because the program value represents a phase or physical state of the memory (e.g., crystalline or amorphous).

In some cases, it may desirable to provide various electrical connections between electrodes utilized in phase change memories.

Thus, there is a need for alternate ways to provide electrical connections for phase change memories.

DETAILED DESCRIPTION

Figure 1:
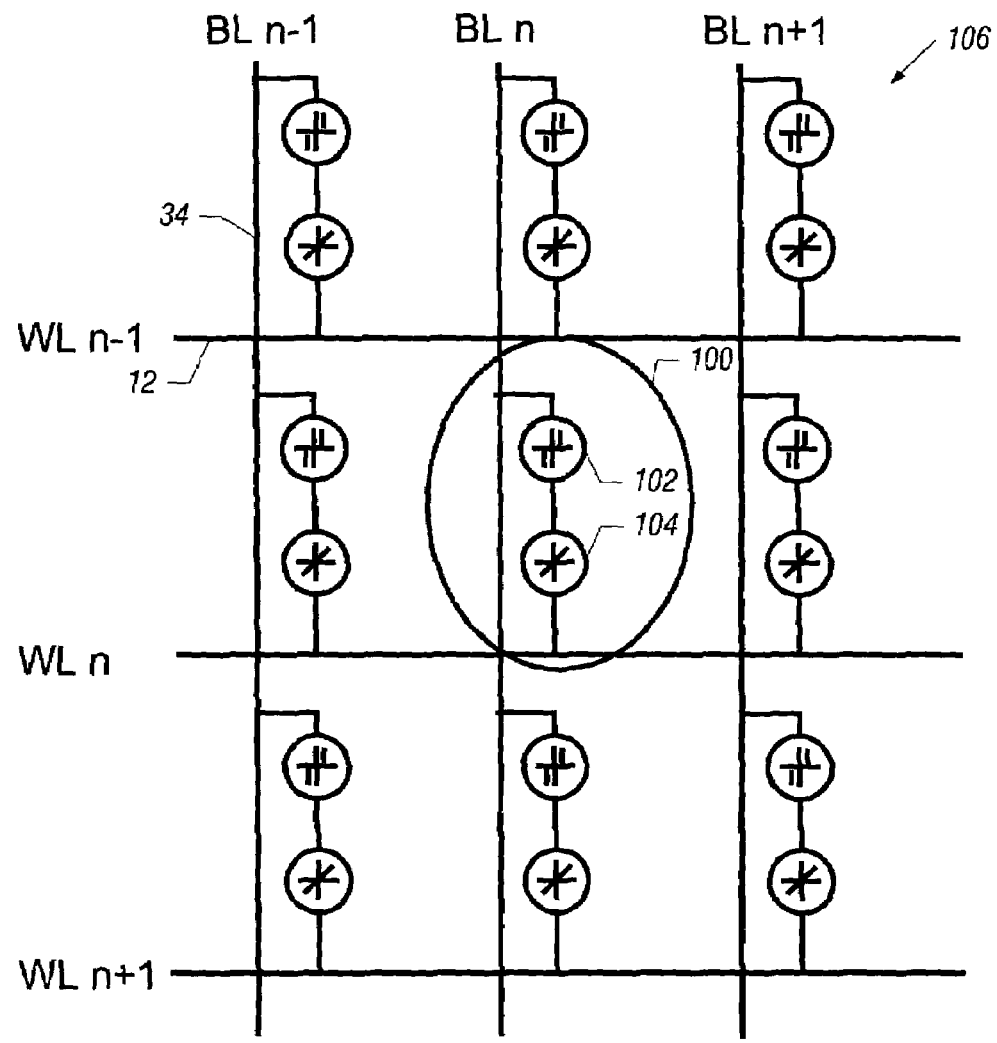
FIG. 1 is a schematic depiction of one embodiment of the present invention.

Referring to FIG. 1, a memory array 106 may be made up of rows 12 and columns 34 of memory cells 100. Each memory cell 100 may include a phase change material threshold switch 102 and a phase change memory element 104. The switch 102 controls the connection of the memory element 104 to the column or bitline 34. Thus, the switch 102 operates as a selection device for the element 104 and the element 104 acts as a storage element, in accordance with one embodiment of the present invention.

In some embodiments of the present invention, the threshold switch 102 and the memory element 104 may be formed one on top of the other in the same integrated circuit. In some embodiments, multiple threshold switches 102 and multiple memory elements 104 may be stacked one on top of the other to form a plurality of planes of memory cells 100. However, in other embodiments, a single threshold switch 102 may be positioned over a single memory element 104 to form a memory cell 100 in an array 106 of memory cells arranged in rows 12 and columns 34.

Figure 2:
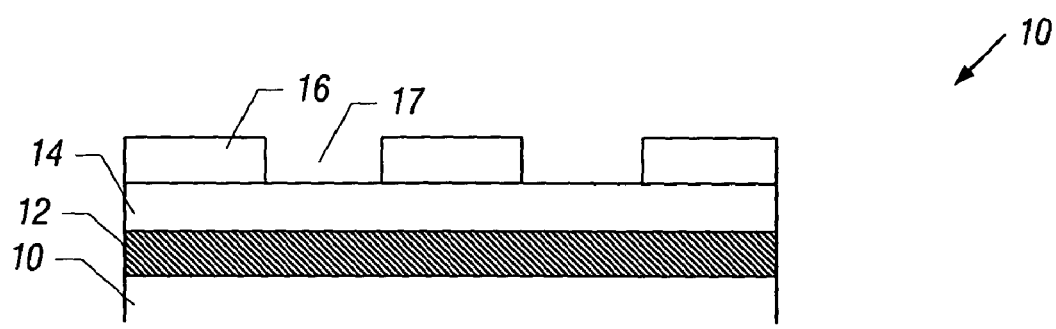
FIG. 2 is a partial, enlarged cross-sectional view of the structure shown in FIG. 1 at an early stage of manufacture in accordance with one embodiment of the present invention.

Referring to FIG. 2, the fabrication of the array 106 of memory cells 100 begins by forming a film 16 that may be patterned. In one embodiment, the film 16 may be made of polysilicon. Underneath the film 16 may be a layer 14 formed of an insulator such as silicon dioxide. Underneath the layer 14 may be a row line conductor 12 and underneath the row line conductor 12 may be an insulator 10 in one embodiment of the present invention. In such an embodiment, stacks of memory arrays 106 may be provided, one over the other.

In accordance with another embodiment of the present invention, the layer 10 may be a part of a semiconductor substrate, the layer 12 may be a buried word line formed in the layer 10 (of the opposite conductivity type of the substrate) and the layer 14 may be an insulator overlying the substrate.

Figure 3:
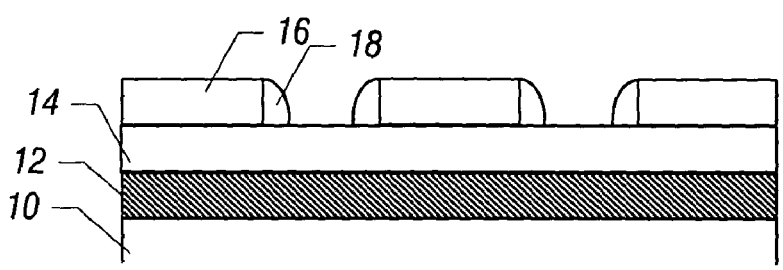
FIG. 3 is a partial, enlarged cross-sectional view at a subsequent stage of manufacture in accordance with one embodiment of the present invention.

Referring to FIG. 3, in order to make a pore of reduced size, such as a sub-lithographic pore whose size may be smaller than the smallest feature size that may be formed with existing lithography techniques, a sidewall spacer 18 may be defined on the patterned film 16 in each opening 17. In one embodiment, the sidewall spacer 18 may be formed of polysilicon. Other techniques may also be used to form small pores.

Figure 4:
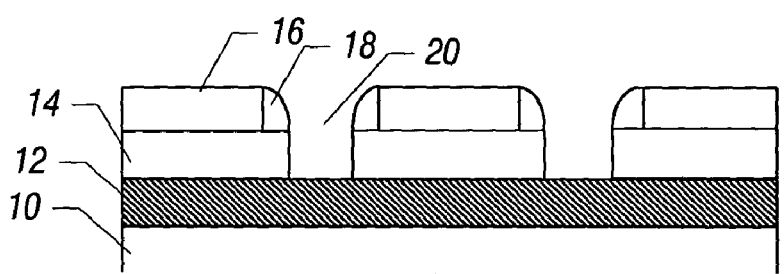
FIG. 4 is a partial, enlarged cross-sectional view at a subsequent stage of manufacture in accordance with one embodiment of the present invention.
Figure 5:
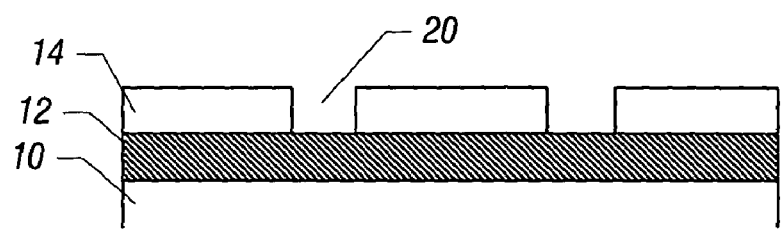
FIG. 5 is a partial, enlarged cross-sectional view at a subsequent stage of manufacture in accordance with one embodiment of the present invention.

Referring next to FIG. 4, the pore 20 may be formed by etching using the sidewall spacers 18 that control the size of the pore 20. After the pore 20 has been formed through the layer 14, the layer 16 and the sidewall spacers 18 may be removed as indicated in FIG. 5.

Figure 6:
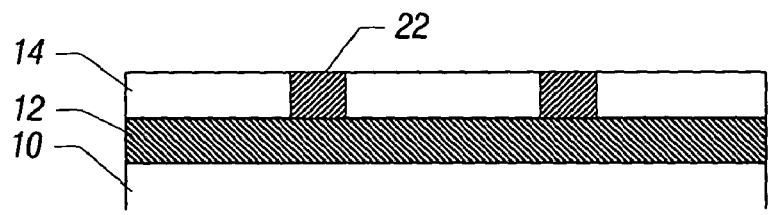
FIG. 6 is a partial, enlarged cross-sectional view at a subsequent stage of manufacture in accordance with one embodiment of the present invention.

Referring to FIG. 6, the pore 20 may then be filled with an electrode 22 to act as the lower electrode of a phase change memory element 104. The electrode 22 may be a resistive material, such as TiSiN, in one embodiment.

Figure 7:
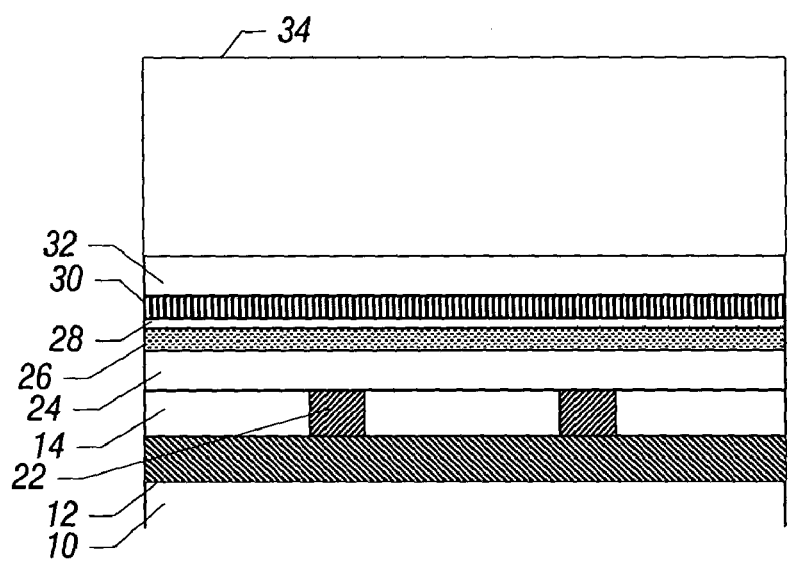
FIG. 7 is a partial, enlarged cross-sectional view at a subsequent stage of manufacture in accordance with one embodiment of the present invention.

Referring to FIG. 7, a stack of layers may be provided to define what ultimately will become the memory cells 100. Starting from the bottom, above the structure previously defined in FIG. 6, is a layer 24 of phase change material. Above that layer 24 is an upper electrode 26. An optional barrier layer 28 may be positioned between the underlying phase change memory element 104 and the overlying threshold switch 102.

In one embodiment, the phase change material layer 24 may be a non-volatile, phase change material. In this embodiment, the memory element 104 may be referred to as a phase change memory. A phase change material may be a material having electrical properties (e.g., resistance) that may be changed through the application of an energy pulse such as, for example, heat, light, voltage potential, or electrical current. Examples of phase change material may include a chalcogenide material or an ovonic material.

An ovonic material may be a material that undergoes electronic or structural changes and acts as a semiconductor once subjected to application of a voltage potential, electrical current, light, heat, etc. A chalcogenide material may be a material that includes at least one element from column VI of the periodic table or may be a material that includes one or more of the chalcogen elements, e.g., any of the elements of tellurium, sulfur, or selenium. Ovonic and chalcogenide materials made by non-volatile memory materials that may be used to store information.

In one embodiment, the memory material may be chalcogenide element composition from the class of tellurium-germanium-antimony ($Te_xGe_ySb_z$) material or a GeSbTe alloy, although the scope of the present invention is not limited to just these.

In one embodiment, if the memory material is a non-volatile, phase change material, the memory material may be programmed into one of at least two memory states by applying an electrical signal to the memory material. An electrical signal may alter the phase of the memory material between a substantially crystalline state and a substantially amorphous state, wherein the electrical resistance of the memory material in the substantially amorphous state is greater than the resistance of the memory material in the substantially crystalline state. Accordingly, in this embodiment, the memory material may be adapted to be altered to one of at least two resistance values within a range of resistance values to provide single bit or multi-bit storage of information.

Programming of the memory material to alter the state or phase of the material may be accomplished by applying voltage potentials to electrodes 22, 26, thereby generating a voltage potential across the memory material. An electrical current may flow through a portion of the memory material in response to the applied voltage potentials, and may result in heating of the memory material.

This heating and subsequent cooling may alter the memory state or phase of the memory material. Altering the phase or state of the memory material may alter an electrical characteristic of the memory material. For example, resistance of the material may be altered by altering the phase of the memory material. The memory material may also be referred to as a programmable resistive material or simply a programmable material.

In one embodiment, a voltage potential difference of about 3 volts may be applied across a portion of the memory material by applying about 3 volts to a lower electrode 22 and about zero volts to an upper electrode 26. A current flowing through the memory material in response to the applied voltage potentials may result in heating of the memory material. This heating and subsequent cooling may alter the memory state or phase of the material.

In a "reset" state, the memory material may be in an amorphous or semi-amorphous state and in a "set" state, the memory material may be in a crystalline or semi-crystalline state. The resistance of the memory material in the amorphous or semi-amorphous state may be greater than the resistance of the material in the crystalline or semi-crystalline state. The association of reset and set with amorphous and crystalline states, respectively, is a convention. Other conventions may be adopted.

Due to electrical current, the memory material may be heated to a relatively higher temperature to amorphisize memory material and "reset" memory material (e.g., program memory material to a logic "0" value). Heating the volume or memory material to a relatively lower crystallization temperature may crystallize memory material and "set" memory material (e.g., program memory material to a logic "1" value). Various resistances of memory material may be achieved to store information by varying the amount of current flow and duration through the volume of memory material.

The information stored in memory material may be read by measuring the resistance of the memory material. As an example, a read current may be provided to the memory material using opposed electrodes 22, 26 and a resulting read voltage across the memory material may be compared against a reference voltage using, for example, a sense amplifier (not shown). The read voltage may be proportional to the resistance exhibited by the memory storage element. Thus, a higher voltage may indicate that memory material is in a relatively higher resistance state, e.g., a "reset" state. A lower voltage may indicate that the memory material is in a relatively lower resistance state, e.g., a "set" state.

The threshold switch 102 may include a lower electrode 30, which in one embodiment may be formed of carbon, an ovonic threshold material 32, and an upper electrode 34. In one example, the material 32 may be TaAsSiGe. The upper electrode may be titanium or titanium nitride in one embodiment. The upper electrode 34 may have a considerable vertical extent to give additional process margin in a damascene process and to avoid a via landing problem as will be explained in more detail hereinafter. A damascene process is used to delineate metal lines in a dielectric.

Figure 8:
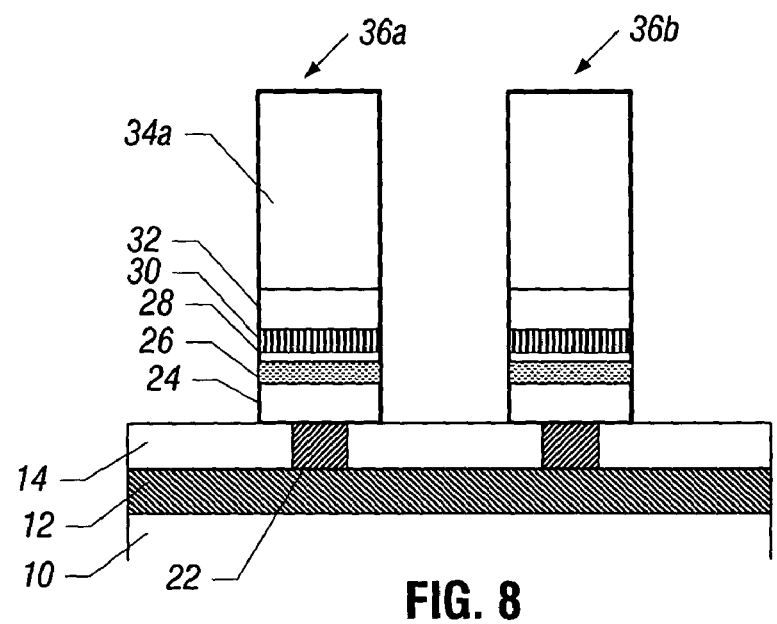
FIG. 8 is a partial, enlarged cross-sectional view at a subsequent stage of manufacture in accordance with one embodiment of the present invention.

Moving to FIG. 8, the structure shown in FIG. 7 may be lithographically defined and etched to form islands 36a and 36b, each corresponding ultimately to different cells 100. In some embodiments, while only a portion of a memory array 106 is shown, in fact a large number of islands 36 may be provided.

Figure 9:
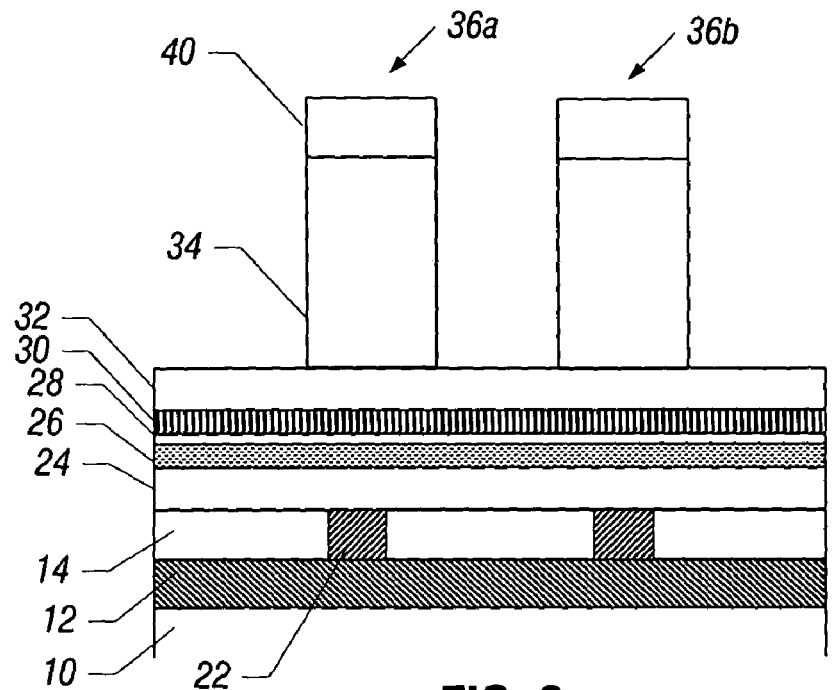
FIG. 9 is a partial, enlarged cross-sectional view of an alternative embodiment in accordance with the present invention.
Figure 10:
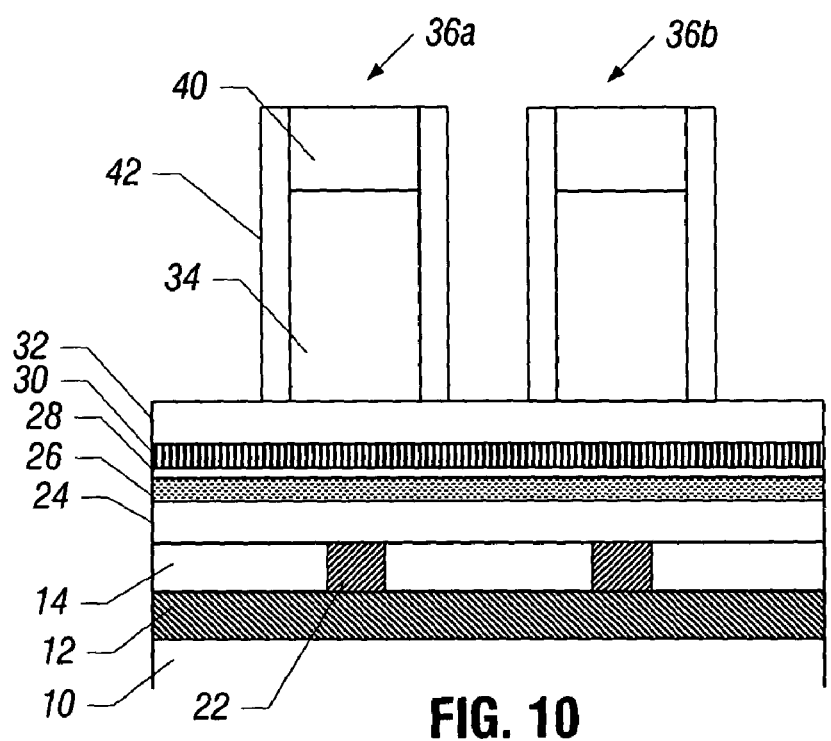
FIG. 10 is a partial, enlarged cross-sectional view at a subsequent stage of manufacture of the embodiment of FIG. 9 in accordance with one embodiment of the present invention.
Figure 11:
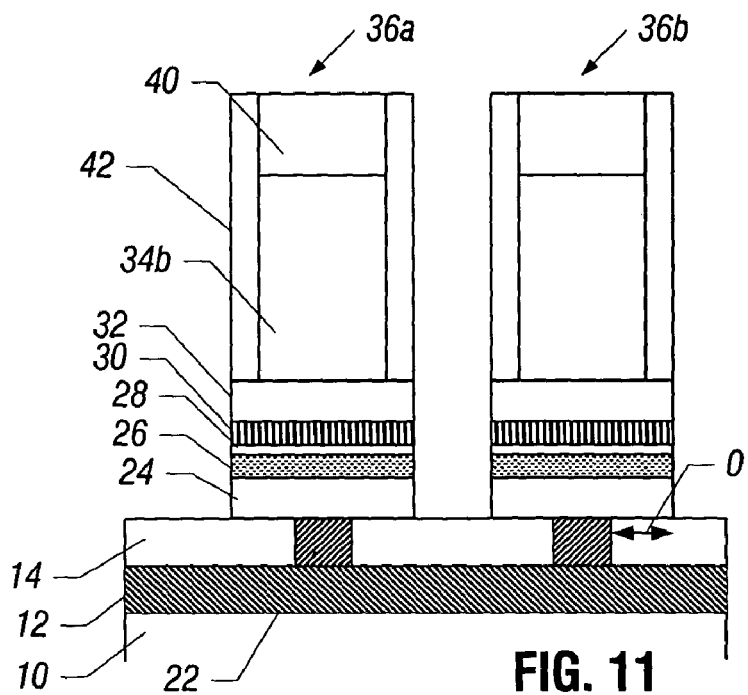
FIG. 11 is a partial, enlarged cross-sectional view at a subsequent stage of manufacture of the embodiment of FIG. 10 in accordance with one embodiment of the present invention.

In an alternative embodiment shown in FIG. 9, the upper electrode 34 may be covered by a hard mask 40 used to define the etching of the upper electrodes 34. After the hard mask 40 has been defined and the upper electrodes 34 have been etched, a sidewall spacer 42 may be provided, as shown in FIG. 10. Then the sidewall spacer 42 may be utilized to form an oversized etch mask for etching the underlying layers to a width wider than the width of the electrode 34, as shown in FIG. 11. As a result, an additional alignment tolerance on each side is achieved. The amount of the additional alignment tolerance is equal to the width of the sidewall spacer 42. The total amount by which the layer 24 overlaps the bottom electrode 22 is indicated as "O" in FIG. 11. Note that this dimension is larger due to the use of the sidewall spacer 42.

Figure 12:
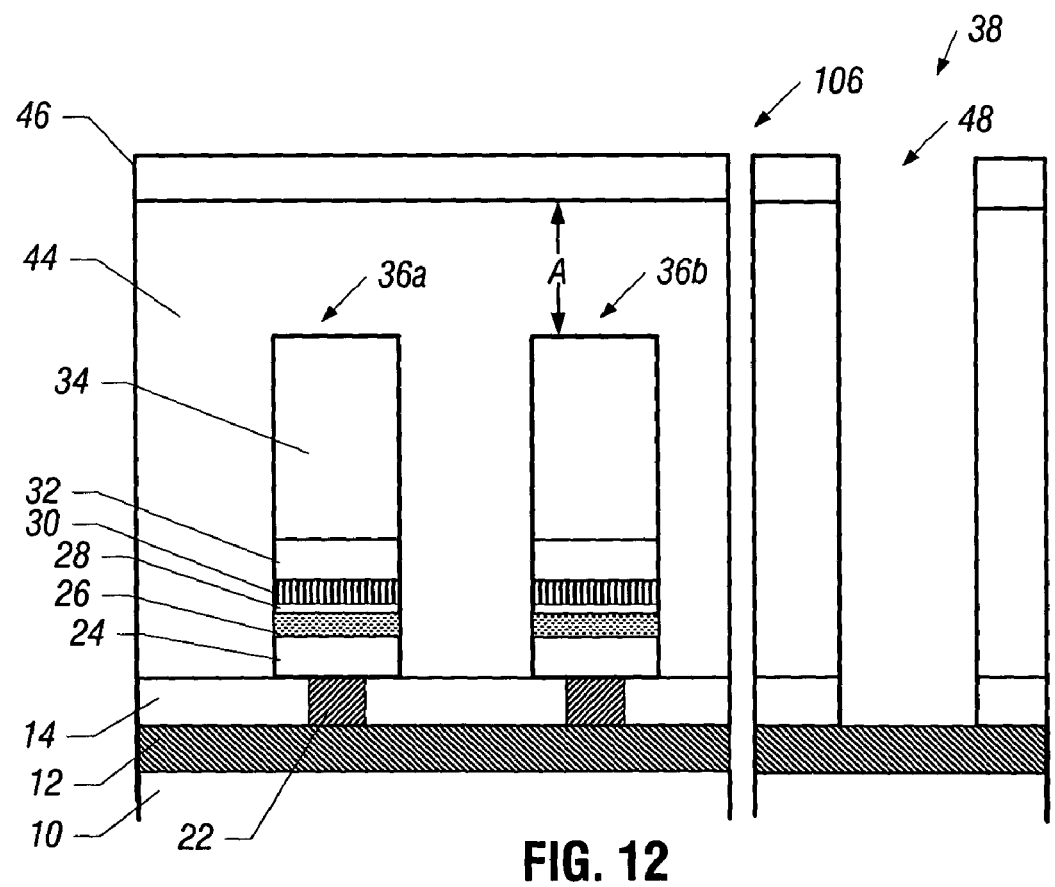
FIG. 12 is a partial, enlarged cross-sectional view at a subsequent stage of manufacture of the embodiment shown in FIG. 8 in accordance with one embodiment of the present invention.

Turning next to FIG. 12 and continuing with the embodiment previously shown in FIG. 8, an insulator 44 is deposited. The insulator 44 may be low dielectric constant dielectric, high density plasma oxide, or spin-on glass, to mention a few examples. The height of the insulator 44 over the islands 36, in one embodiment, is indicated as A in FIG. 12. Over the insulator 44, an optional etch stop 46 may be formed. In one embodiment, the etch stop 46 may be $SiO_xN_y$, or $SiO_xC_y$, or $Si_3N_4$. The etch stop 46 may be utilized to define a via 48 which extends through the insulator 44 and the layer 14 down to the conductive line 12. The via 48 is formed in the periphery 38 in accordance with one embodiment of the present invention.

Figure 13:
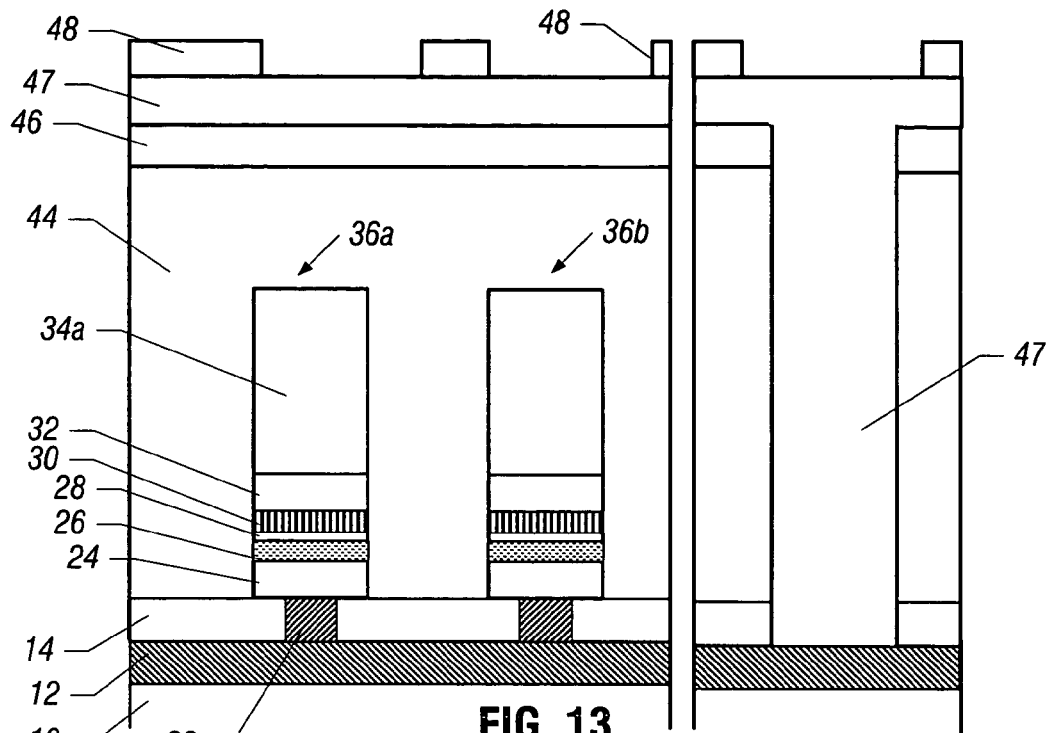
FIG. 13 is a partial, enlarged cross-sectional view at a subsequent stage of manufacture in accordance with one embodiment of the present invention.

Referring next to FIG. 13, the structure shown in FIG. 12 may be coated with a sacrificial light absorbing material (SLAM) 47 that fills the via 48 in the periphery and covers the memory array 106 including islands 36. A photoresist 48 may be deposited and patterned in the desired pattern to form subsequent structures described hereinafter.

Figure 14:
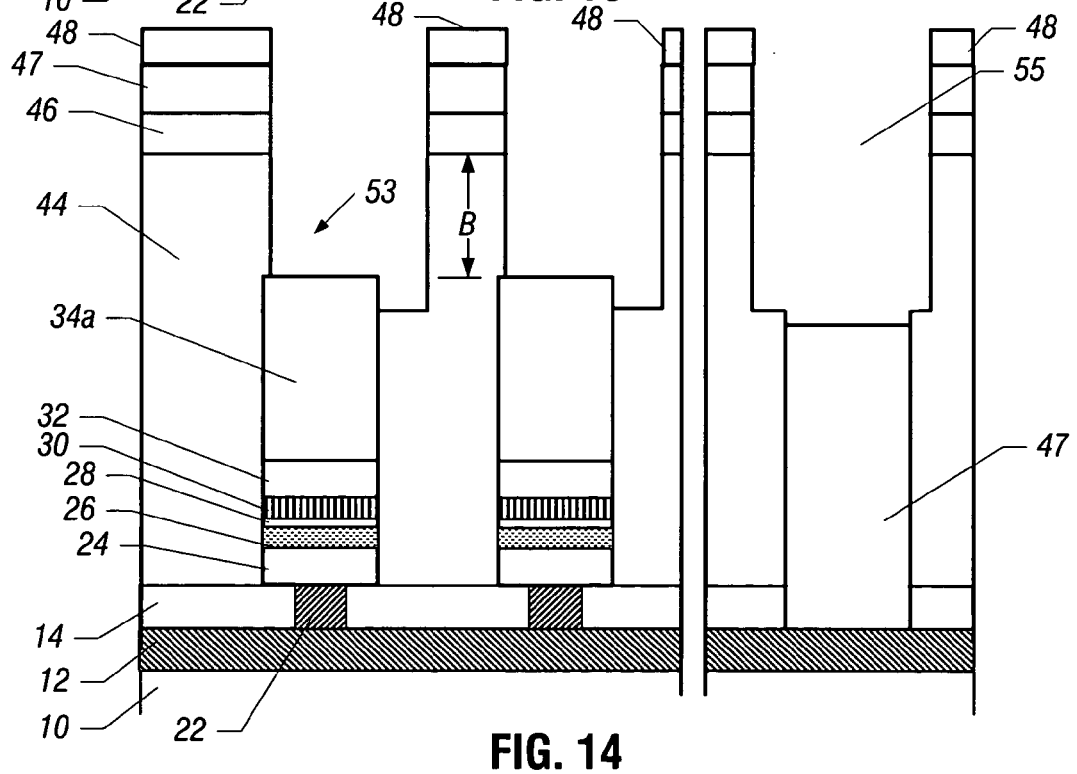
FIG. 14 is a partial, enlarged cross-sectional view at a subsequent stage of manufacture in accordance with one embodiment of the present invention.

As shown in FIG. 14, the photoresist 48 may be utilized to define grooves 53 in the memory array 106 and the groove 55 in the periphery 38. The grooves 53 and 55 may have the same depth in some embodiments. A portion of the SLAM 47 remains below the groove 55. The minimum depth of the groove 53, below the etch stop 46, is indicated as B. In some embodiments of the present invention it is desirable that the dimension B be greater than or equal to the dimension A, shown in FIG. 12.

Figure 15:
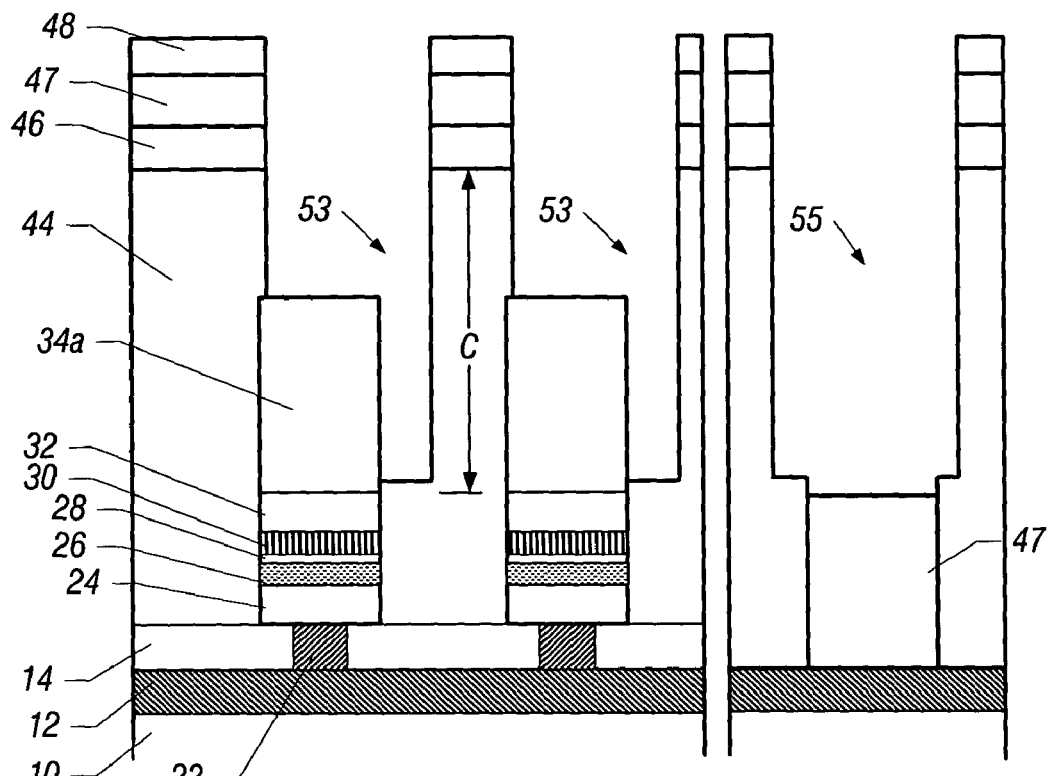
FIG. 15 is a partial, enlarged cross-sectional view at a subsequent stage of manufacture in accordance with one embodiment of the present invention.

Referring next to FIG. 15, the grooves 53 may be extended to a maximum depth C in one embodiment. Conventional selective etching techniques may be utilized such that the etchant etches the insulator 44 but does not etch the electrode 34. The maximum etch depth may not be greater than the depth C in some embodiments of the present invention. As a result, no separate via is utilized between each threshold switch upper electrode 34 and the top column line. In some embodiments this may save the process steps associated with lithography and etch steps needed to form a dedicated via between the column metal, as well as permitting a smaller cell size since less margin is required for misalignment of such a via and the threshold switch top electrode. Some misalignment between the column line and the upper electrode 34 of the threshold switch 102 may be permitted.

Figure 16:
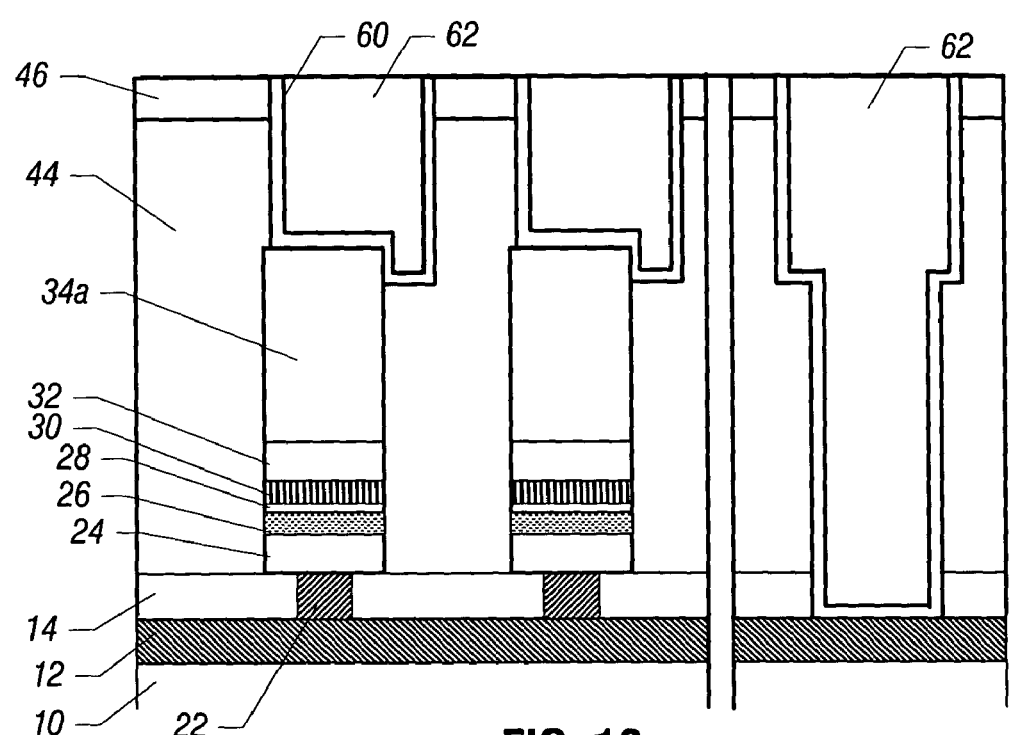
FIG. 16 is a partial, enlarged cross-sectional view at a subsequent stage of manufacture in accordance with one embodiment of the present invention.

Referring to FIG. 16, the resist 48 and horizontal layer of SLAM 47, may be stripped, a barrier metal layer 60 may be deposited, and copper 62 may be electroplated. In one embodiment, the barrier layer is a chemical vapor deposited tantalum nitride. The resulting structure can be subjected to chemical mechanical polishing to planarize the upper surface. Additional memory arrays 106 may be formed over the structure shown in FIG. 6 thereafter in some embodiments.

In some embodiments, the depth A is the depth through the insulator 44 down to the upper electrode 34. The depth B is the minimum depth of the groove 53 so that contact can be made to the upper electrode 34. In all cases, a greater groove 53 depth may be used, but generally the depth B is greater than the depth A. The depth C is the maximum depth that a groove 53 may be etched, in some embodiments, because then there is the possibility of shorting past the electrode 34.

In some embodiments of the present invention, the threshold switch 102 is coupled to a top column line conductor and the memory element 104 is coupled to on bottom row line conductor 12. Those skilled in the art will understand that the designations "row" and "column" may be arbitrary in that the switch 102 may be coupled to a row and the memory element 104 may be coupled to a column in some embodiments.

Similarly, while an embodiment is illustrated in which the switch 102 is over the memory element 104, the positions may be switched as well so that the memory element 104 is on top of the switch 102. However, there are some advantages in some embodiments to maintaining the switch 102 over element 104 orientation. For example, it may be easier to produce a lower electrode 22 of reduced size when the memory element 104 is put down first.

Figure 17:
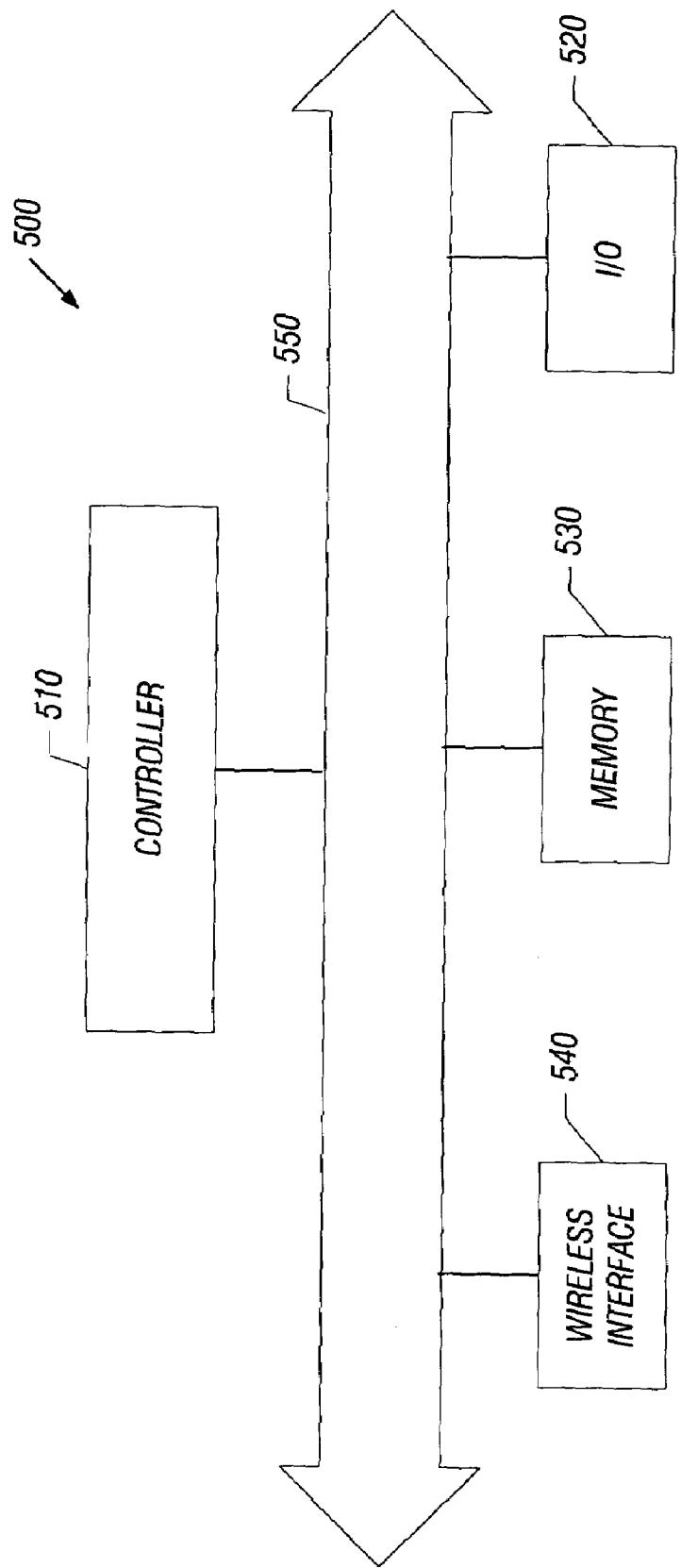
FIG. 17 is a system depiction of one embodiment of the present invention.

Turning to FIG. 17, a portion of the system 500 in accordance with an embodiment of the present invention is described. The system 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. The system 500 may be used in any of the following systems: a wireless local area network (WLAN) system, a wireless personal area network (WPAN) system, or a cellular network, although the scope of the present invention is not limited in this respect.

The system 500 may include a controller 510, an input/output (I/O) device 520 (e.g., a keypad display), a memory 530, and a wireless interface 540 coupled to each other via a bus 550. It should be noted that the scope of the present invention is not limited to embodiments having any or all of these components.

The controller 510 may comprises, for example, one or more microprocessors, digital signal processors, microcontrollers, or the like. The memory 530 may be used to store messages transmitted to or by the system. The memory 530 may also be optionally used to store instructions that are executed by the controller 510. During the operation of the system 500 it may be used to store user data. The memory 530 may be provided by one or more different types of memory. For example, a memory 530 may comprise a volatile memory (any type of random access memory), a non-volatile memory such as a flash memory, and/or phase change memory that includes a memory such as, for example, memory element 104 and switch 102.

The I/O device 520 may be utilized to generate a message. The system 500 may use the wireless interface 540 to transmit and receive messages to and from a wireless communication network with a wireless radio frequency (RF) signal. Examples of the wireless interface 540 may include an antenna or a wireless transceiver, such as a dipole antenna, although the scope of the present invention is not limited in this respect.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    forming a phase change memory including a phase change storage element and a phase change threshold switch;
    forming the phase change storage element and the phase change threshold switch within a memory area and providing a periphery beside said memory area, said periphery including no phase change memory elements; and
    forming a damascene via to a conductive line in said periphery.

2. The method of claim 1 including forming said switch over said element.

3. The method of claim 2 including forming, in said memory, a pore over a substrate, said pore having a dimension smaller than the feature size possible with lithographic techniques.

4. The method of claim 3 including forming said pore by forming an aperture through an insulator and forming a sidewall spacer in said aperture.

5. The method of claim 4 including forming a lower electrode of said phase change storage element in said pore.

6. The method of claim 1 including forming a barrier layer between said threshold switch and said storage element.

7. The method of claim 1 including forming an upper electrode over said phase change storage element, said upper electrode having a vertical extent at least twice its horizontal extent.

8. The method of claim 1 including forming an electrode over said phase change storage element, said electrode having sidewall spacers.

9. The method of claim 8 including using said sidewall spacers as a mask to etch through underlying layers.

10. The method of claim 1 wherein forming said phase change memory includes forming a memory array including a plurality of memory cells as a plurality of integrated islands spaced from one another.

11. The method of claim 10 including filling the regions surrounding said islands with an insulator.

12. The method of claim 11 including forming said insulator to a height over the upper extent of said islands.

13. The method of claim 12 including forming grooves through said insulator down to and past the upper extent of said islands.

14. The method of claim 12 including forming said insulator over the memory area and the periphery and forming a vertical groove in said insulator over said memory area and a vertical groove in said insulator over said periphery.

15. The method of claim 14 including filling said groove in said periphery with a sacrificial light absorbing material.

16. The method of claim 15 including etching said sacrificial light absorbing material in said groove in said periphery.

17. The method of claim 16 wherein forming said damascene via includes filling said groove in the periphery with a conductive material.

18. The method of claim 17 including forming said groove in said periphery deeper than said groove in the memory array.

19. The method of claim 18 including forming an upper electrode over said phase change storage element and forming said groove in said periphery to a depth below the upper extent of said upper electrode and below the lower extent of said upper electrode.

* * * * *